(12) United States Patent
Saito

(10) Patent No.: US 12,100,620 B2
(45) Date of Patent: Sep. 24, 2024

(54) WAFER PROCESSING METHOD AND MACHINE

(71) Applicant: DISCO CORPORATION, Tokyo (JP)

(72) Inventor: Yoshinobu Saito, Tokyo (JP)

(73) Assignee: DISCO CORPORATION, Tokyo (JP)

(*) Notice: Subject to any disclaimer, the term of this patent is extended or adjusted under 35 U.S.C. 154(b) by 546 days.

(21) Appl. No.: 17/323,252

(22) Filed: May 18, 2021

(65) Prior Publication Data

US 2021/0384076 A1    Dec. 9, 2021

(30) Foreign Application Priority Data

Jun. 5, 2020    (JP) ................................ 2020-098381

(51) Int. Cl.
| | |
|---|---|
| H01L 21/67 | (2006.01) |
| H01L 21/304 | (2006.01) |
| H01L 21/683 | (2006.01) |
| H01L 21/687 | (2006.01) |
| H01L 21/78 | (2006.01) |

(52) U.S. Cl.
CPC .......... *H01L 21/78* (2013.01); *H01L 21/3043* (2013.01); *H01L 21/67092* (2013.01); *H01L 21/6836* (2013.01); *H01L 21/687* (2013.01); H01L 2221/68336 (2013.01); H01L 2221/6834 (2013.01)

(58) Field of Classification Search
None
See application file for complete search history.

(56) References Cited

U.S. PATENT DOCUMENTS

| | | | |
|---|---|---|---|
| 2015/0332928 A1* | 11/2015 | Priewasser | ........ H01L 21/67046 438/460 |
| 2016/0346956 A1* | 12/2016 | Takekawa | .............. B28D 7/005 |
| 2018/0292758 A1* | 10/2018 | Chao | .................. G03F 7/70925 |

FOREIGN PATENT DOCUMENTS

| | | | |
|---|---|---|---|
| JP | 02178948 A | | 7/1990 |
| JP | 10305420 A | | 11/1998 |
| JP | 2009278029 A | * | 11/2009 |
| JP | 2015126054 A | | 7/2015 |
| JP | 2018187707 A | * | 11/2018 ....... H01L 21/67092 |

OTHER PUBLICATIONS

Machine translation of JP 2018187707 A, 2018, (Year: 2018).*
Translation of JP 2009278029 A (Year: 2009).*
DE Machine Translated Office Action for corresponding DE Patent Application No. 10 2021 205 568.0 dated Mar. 22, 2024 (7 pages).

* cited by examiner

*Primary Examiner* — Suberr L Chi
*Assistant Examiner* — Carnell Hunter, III
(74) *Attorney, Agent, or Firm* — Greer, Burns & Crain, Ltd.

(57) ABSTRACT

In a processing method for a wafer with a mark formed in an outer peripheral portion thereof, a frame unit having the wafer, a tape, and a ring frame is provided, a set of processing conditions for processing the wafer is selected, and a representative image associated with the set of processing conditions is displayed on a display unit. The ring frame includes a notch formed in an outer periphery thereof. In the frame unit, the mark and the notch are in a positional relationship set in accordance with the set of processing conditions. The positional relationship is presented in the representative image.

4 Claims, 5 Drawing Sheets

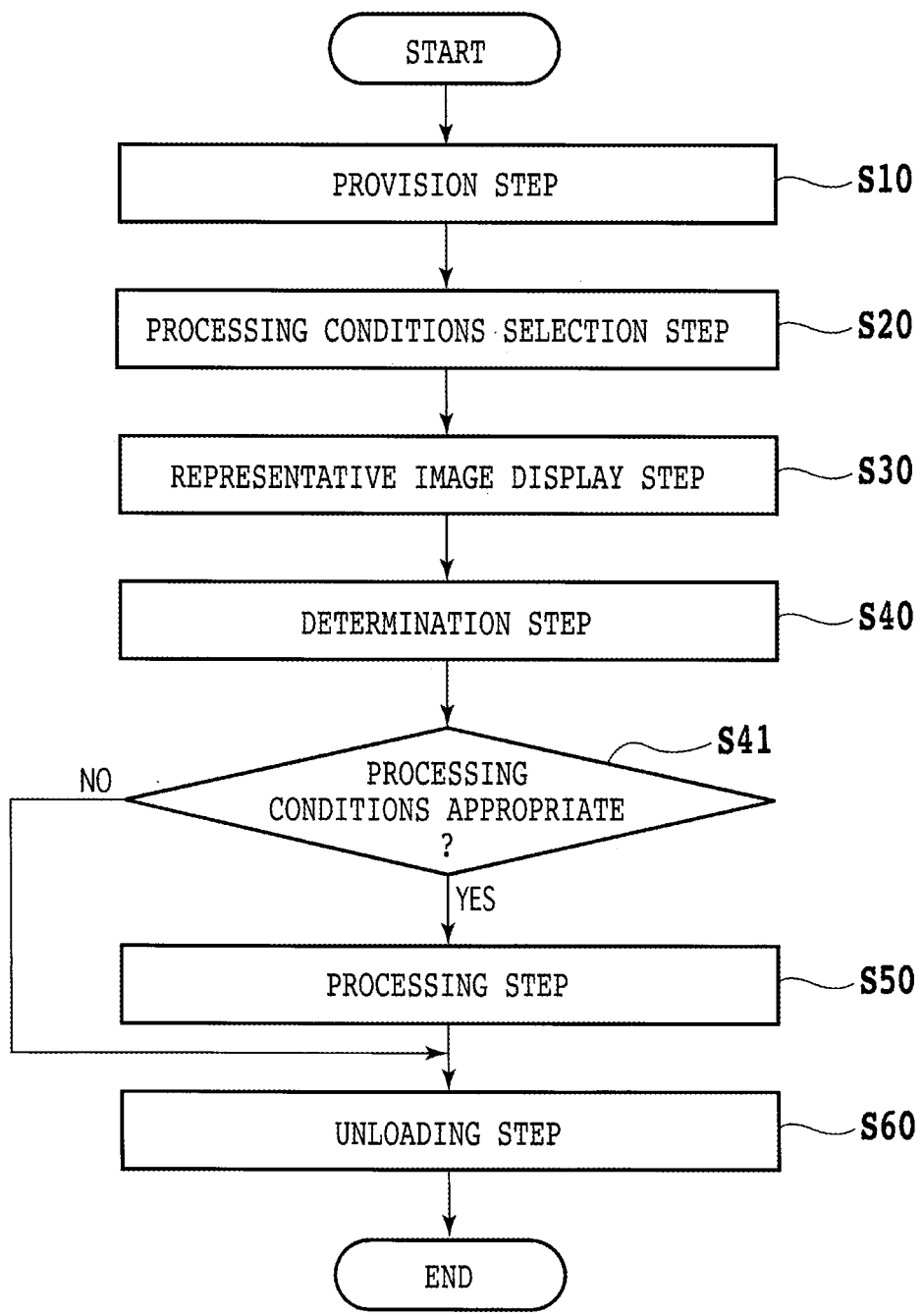

WAFER PROCESSING METHOD AND MACHINE

BACKGROUND OF THE INVENTION

Field of the Invention

The present invention relates to a wafer processing method and machine for processing a wafer supported in an opening of a ring frame via an adhesive tape.

Description of the Related Art

When manufacturing device chips to be mounted on electronic equipment, a plurality of intersecting dicing lines (hereinafter called "streets") is first set on a front surface of a semiconductor wafer, and devices such as integrated circuits (ICs) or large-scale integrations (LSI) circuits are then formed in individual regions defined by the streets, respectively. Subsequently, the wafer is ground from a side of a back surface thereof by a grinding machine to thin the wafer, and the thinned wafer is divided along the streets by using a cutting machine, a laser processing machine, or the like. Consequently, individual device chips are obtained.

On various processing machines such as grinding machines, cutting machines, and laser processing machines, wafers are each processed under appropriate processing conditions corresponding to the specifications of the wafer and device chips formed on the wafer (see, for example, JP 2015-126054 A, JP H10-305420 A, and so on). In a control unit of each processing machine, a plurality of sets of processing conditions for processing various wafers, respectively, have been stored beforehand, and an operator selects appropriate one set of processing conditions from the stored plurality of sets of processing conditions, and causes the processing machine to perform processing.

SUMMARY OF THE INVENTION

However, many sets of processing conditions are stored in a processing machine, and sets of processing conditions, which are similar to one another, are also included. When selecting an appropriate set of processing conditions in accordance with the specifications of a wafer and devices formed thereon, an operator may select a wrong set of processing conditions. The selection of the wrong set of processing conditions may lead not only to a failure in obtaining desired processing results, but also to damage such as cracking or chipping on the wafer and a malfunction of the processing machine.

The present invention therefore has as objects thereof the provision of a wafer processing method and machine, which can process a wafer under an appropriate set of processing conditions by avoiding an error in selecting a set of processing conditions.

In accordance with a first aspect of the present invention, there is provided a wafer processing method for processing a wafer, in an outer peripheral portion of which a mark is formed, by a processing machine including a processing unit and a display unit. The wafer processing method includes a provision step of providing a frame unit having the wafer, a tape bonded on a front surface or back surface of the wafer and having a diameter greater than the wafer, and a ring frame having an opening greater in diameter than the wafer and carrying at an inner peripheral portion thereof the tape bonded at an outer peripheral portion thereof to the ring frame, a processing conditions selection step of selecting one set of processing conditions for processing the wafer by the processing unit from a plurality of sets of processing conditions stored in the processing machine, and a representative image display step of displaying a representative image that is stored in the processing machine in association with the set of processing conditions as selected in the processing conditions selection step, on the display unit. The ring frame has a notch formed in an outer periphery thereof. In the frame unit, the mark formed in the outer peripheral portion of the wafer and the notch of the ring frame are in a positional relationship set in accordance with the selected set of processing conditions for processing the wafer by the processing unit. The frame unit provided in the provision step is formed of the ring frame, the wafer, and the tape integrated together so that the notch of the ring frame and the mark of the wafer are in the positional relationship. The representative image displayed on the display unit in the representative image display step presents a representative example of the frame unit, in which the notch of the ring frame and the mark of the wafer are in the positional relationship.

Preferably, the wafer processing method may further include a determination step of, after the representative image display step, determining through a comparison between the representative example presented in the representative image and the frame unit provided in the provision step whether the selected set of processing conditions is appropriate or inappropriate. If the selected set of processing conditions is determined to be appropriate in the determination step, a processing step is performed to process the wafer by the processing unit under the selected set of processing conditions. If the selected set of processing conditions is determined to be inappropriate in the determination step, an unloading step is performed to unload the frame unit from the processing machine.

Also, preferably, the processing to be performed in the processing step may be dicing processing to divide the wafer, and the selected set of processing conditions may include a size of the wafer, a distance between streets set on the wafer, processing feed speeds of the processing unit and the wafer, and a key pattern formed on the front surface or back surface of the wafer.

In accordance with the present invention, there is provided a wafer processing machine for processing a wafer integrated with a ring frame and a tape into a frame unit and included as a part of the frame unit. The wafer processing machine includes a chuck table configured to hold the wafer to be processed, a processing unit that processes the wafer held on the chuck table, a display unit, and a control unit configured to control the chuck table, the processing unit, and the display unit. The control unit includes a storage section configured to store a plurality of sets of processing conditions for processing a plurality of wafers that includes the wafer to be processed, by the processing unit, and a plurality of representative images presenting frame units including the wafers to be processed under the respective sets of processing conditions, and a display control section configured, when one set of processing conditions is selected from the plurality of sets of processing conditions stored in the storage section, to display, on the display unit, the representative image presenting the frame unit that includes the wafer to be processed under the selected set of processing conditions. In the frame unit, a mark formed in an outer peripheral portion of the wafer and a notch of the ring frame are in a positional relationship set in accordance with the selected set of processing conditions for processing the wafer by the processing unit.

In the wafer processing method according to the first aspect of the present invention and the wafer processing machine according to the present invention, a set of processing conditions for processing a wafer to be processed is selected from a plurality of sets of processing conditions stored beforehand in the processing machine. In the processing machine, representative images of frame units, which include wafers to be processed under the corresponding ones of the sets of processing conditions, respectively, are stored. When one set of processing conditions is selected, the representative image stored in association with the selected set of processing conditions is displayed on the display unit of the processing machine.

In the above-described frame unit, the positional relationship between the notch of the ring frame and the mark in the outer peripheral portion of the wafer is set beforehand for every one of the plurality of sets of processing conditions. When forming the frame unit, the wafer and the ring frame are adjusted in directions so that the corresponding positional relationship is satisfied. When the corresponding one set of processing conditions is selected for processing the wafer, the operator can therefore verify whether or not the positional relationship between the mark in the outer peripheral portion of the wafer to be processed and the notch of the associated ring frame conforms to the representative image displayed on the display unit. If they are verified to conform to each other in the positional relationship as a result, the operator can understand that the selected set of processing conditions is appropriate. If they are verified not to conform to each other in the positional relationship as a result, on the other hand, it is verified that the selected set of processing conditions and the wafer do not correspond to each other. If this is the case, the operator can stop the processing machine to perform the processing, thereby enabling to avoid problems to the wafer and processing machine and to correct an error or the like in selecting a set of processing conditions so that appropriate processing can be performed.

The present invention therefore provides the wafer processing method and machine, which can avoid an error in selecting a set of processing conditions and can process a wafer under an appropriate set of processing conditions.

The above and other objects, features and advantages of the present invention and the manner of realizing them will become more apparent, and the invention itself will best be understood from a study of the following description and appended claims with reference to the attached drawings depicting or illustrating preferred embodiments of the invention.

BRIEF DESCRIPTION OF THE DRAWINGS

FIG. 5 is a flow chart illustrating a flow of individual steps of the wafer processing method according to the embodiment of the first aspect of the present invention.

DETAILED DESCRIPTION OF THE PREFERRED EMBODIMENT

Figure 1A:
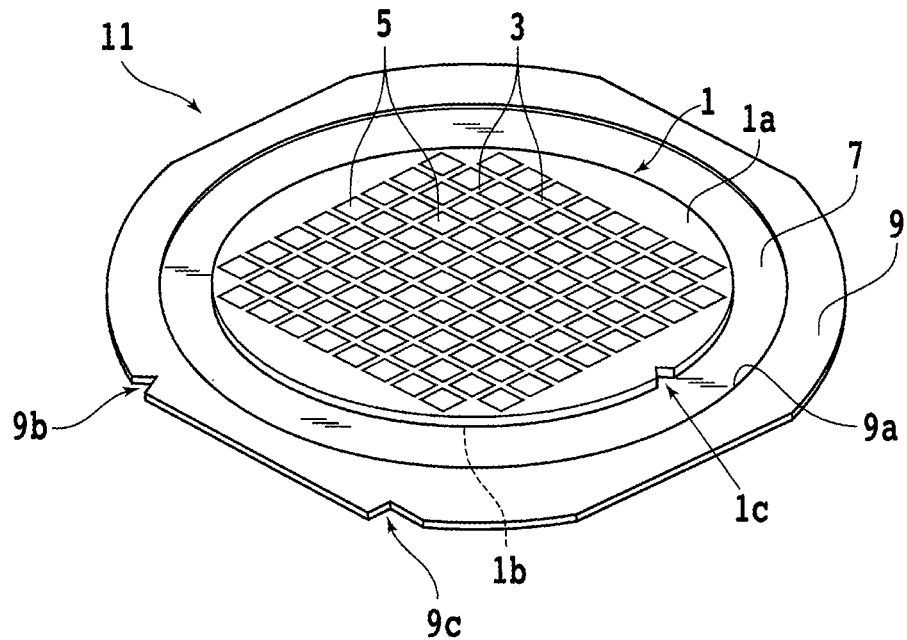
FIG. 1A is a perspective view of a frame unit including a wafer to be processed by a wafer processing method and machine according to embodiment of the present invention.
Figure 1B:
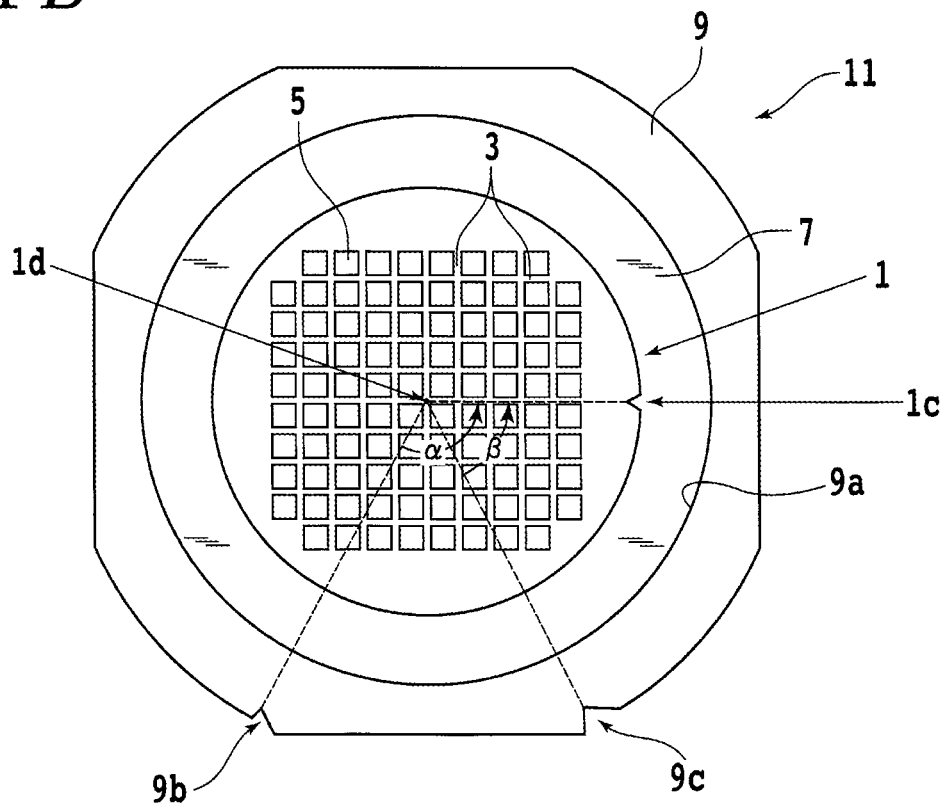
FIG. 1B is a plan view of the frame unit of FIG. 1A.

With reference to the attached drawings, a description will be made about embodiment of the present invention. A description will first be made about a wafer 1 to be processed and devices formed thereon. The wafer 1 is a substantially disc-shaped substrate, and is formed of a material such as a semiconductor, for example, silicon, silicon carbide (SiC), gallium nitride (GaN), or the like. As an alternative, the wafer 1 may be formed of a material such as sapphire, glass, or quartz. FIG. 1A is a perspective view of a frame unit 11 including the wafer 1 to be processed by a wafer processing method and machine according to the embodiment of the present invention, and FIG. 1B is a plan view of the frame unit 11 of FIG. 1A. On a front surface 1a of the wafer 1, a plurality of intersecting streets 3 is set. In individual regions defined by the streets 3, devices 5 such as ICs or LSI circuits are formed. In an outer peripheral portion of the wafer 1, a notch-shaped mark 1c that indicates the crystal orientation of the wafer 1 and is called "notch" is formed. However, the mark 1c is not limited to such a notch. If a straight cut-out portion that indicates the crystal orientation of the wafer 1 and is called "orientation flat" is formed in the outer peripheral portion of the wafer 1, for example, the orientation flat may also be used as the mark 1c.

When processed along the streets 3, the wafer 1 is divided into a plurality of device chips. When desired to process the wafer 1, a tape 7 that has a greater diameter than the wafer 1 is bonded to a side of, for example, a back surface (one surface) 1b of the wafer 1. The tape 7 is called "dicing tape." The tape 7 has a film-shaped base material layer having flexibility. The base material layer is formed of polyolefin (PO), polyethylene terephthalate (PET), polyvinyl chloride (PVC), polystyrene (PS), or the like. On one side of the base material layer, an adhesive layer (glue layer) is disposed. The adhesive layer is formed of a UV-curable silicone rubber, acrylic material, epoxy-based material, or the like. This adhesive layer is bonded to the side of the back surface 1b of the wafer 1. The bonding of the tape 7 to the wafer 1 enables to reduce impacts on the wafer 1 during cutting, transfer and the like, and hence to lower damage on the wafer 1.

To an outer peripheral portion of the tape 7, a ring frame 9 formed of a metal such as aluminum or stainless steel is bonded at an inner peripheral portion thereof. The ring frame 9 has an opening 9a greater in diameter than the wafer 1. In an outer periphery of the ring frame 9, a first notch 9b and a second notch 9c are formed. The first notch 9b is formed with an acute angle as viewed in plan. The second notch 9c has a shape different from the first notch 9b. The second notch 9c is formed with a substantially right angle as viewed in plan. However, the shapes and number of the notches disposed in the outer periphery of the ring frame 9 are not limited to the above-mentioned examples. In the outer periphery of the ring frame 9, only one of the first notch 9b and the second notch 9c may be disposed. As a further alternative, three or more notches may be disposed in the outer periphery of the ring frame 9.

The frame unit 11 is formed by bonding the tape 7 to the side of the back surface 1b of the wafer 1 and the one side of the ring frame 9 with the wafer 1 being positioned substantially centrally in the opening 9a of the ring frame 9. When desired to bond the tape 7 to the wafer 1 and the ring frame 9, a tape bonding apparatus (not depicted) is used, for example. The tape bonding apparatus bonds the tape 7 to the wafer 1 and the ring frame 9 with the ring frame 9 being arranged so that the first notch 9b and second notch 9c have predetermined positional relationships with the position of the mark 1c. Consequently, the wafer 1 is supported on the ring frame 9 via the tape 7. At this time, the position of the wafer 1 is fixed relative to the ring frame 9 in the direction of a plane parallel to the back surface 1b (or the front surface 1a). In other words, the relative positional relationships between the mark 1c and the first notch 9b and second notch 9C are fixed in the direction of the plane of the wafer 1.

Figure 2:
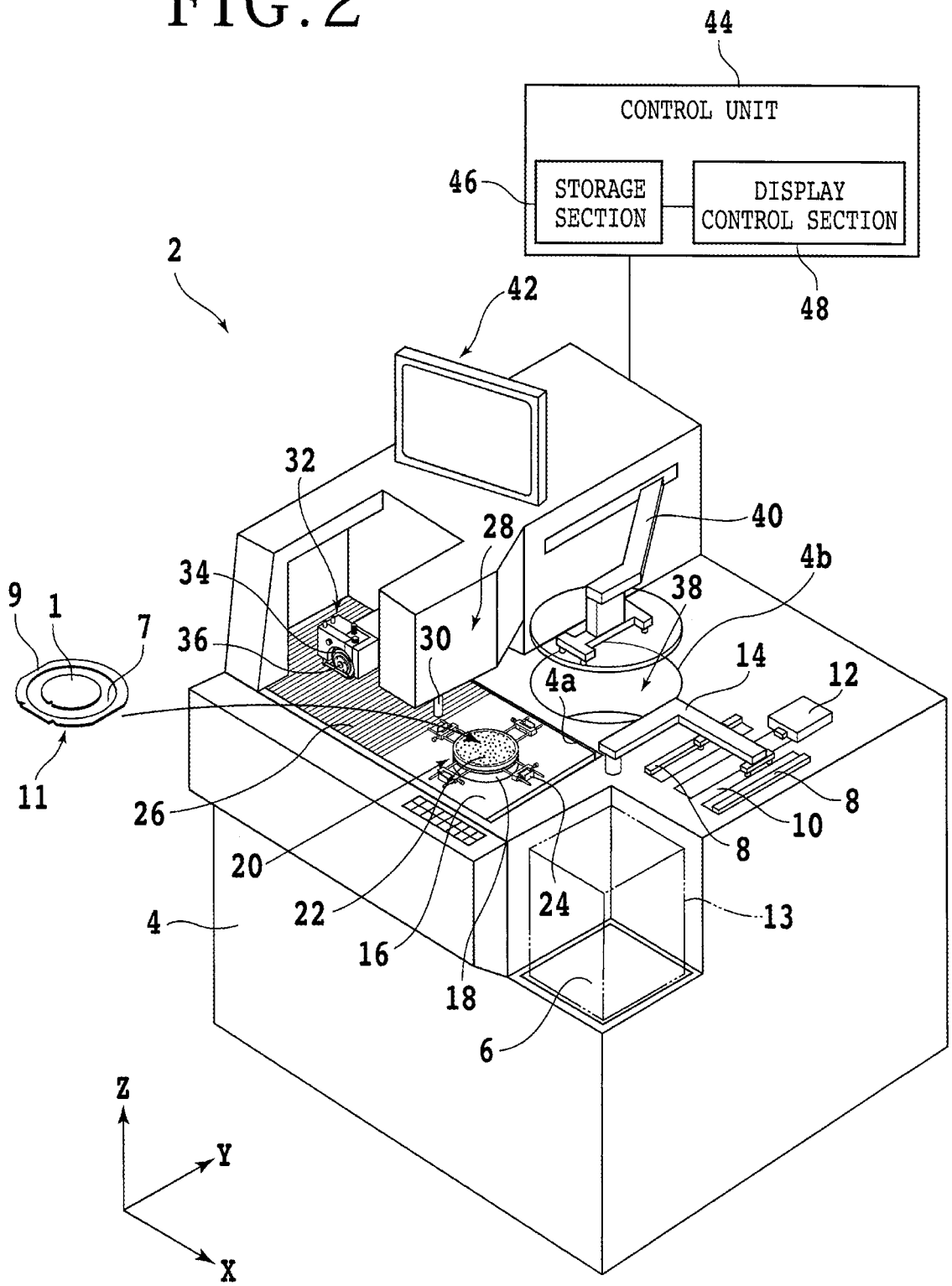
FIG. 2 is a perspective view schematically depicting a cutting machine as an example of the wafer processing machine according to the embodiment of the present invention.

The wafer 1, which has been integrated with the tape 7 and the ring frame 9 into the frame unit 11 and included as a part of the frame unit 11, is next processed by the processing machine. FIG. 2 is a perspective view schematically depicting a cutting machine 2 as an example of the wafer processing machine according to the embodiment of the present invention. However, the processing machine is not limited to the cutting machine 2. In FIG. 2, some elements are simplified and depicted as blocks.

As depicted in FIG. 2, a cassette table 6 on which a cassette 13 is mounted is disposed in a corner part of a bed 4 of the cutting machine 2. The cassette table 6 is movable up and down in an up-down direction (Z-axis direction) by a lift mechanism (not depicted). In FIG. 2, the contour of the cassette 13 mounted on the cassette table 6 is indicated by two-dot chain lines.

At a position on an upper wall of the bed 4 and adjacent the cassette table 6, a temporary placement table 10 is disposed. The temporary placement table 10 includes a pair of guide rails 8 that are movable close to or away from each other while being maintained in parallel to a Y-axis direction (left-right direction, indexing feed direction). At a position on the upper wall of the bed 4 and adjacent the temporary placement table 10, an unloading unit 12 is disposed to unload the frame unit 11, which is held in the cassette 13 mounted on the cassette table 6, from the cassette 13. The unloading unit 12 has on a front wall thereof a grasping portion that can grasp the ring frame 9. When desired to unload the frame unit 11 held in the cassette 13, the unloading unit 12 is moved toward the cassette 13 to allow the grasping portion to grasp the ring frame 9, and subsequently the unloading unit 12 is moved in a direction away from the cassette 13. Then, the frame unit 11 is pulled out from the cassette 13 onto the temporary placement table 10. At this time, the paired guide rails 8 are moved closer to each other in an X-axis direction in association with the pull-out of the frame unit 11, whereby the ring frame 9 is held between the paired guide rails 8 and the frame unit 11 is positioned at a predetermined location.

At a position on the upper wall of the bed 4 and adjacent the cassette table 6, an opening 4a is formed, elongated in the X-axis direction (front-rear direction, processing feed direction). In the opening 4a, an undepicted X-axis moving mechanism (processing feeding unit) of the ball screw type and a corrugated dust/splash cover 26 are arranged. The dust/splash cover 26 covers an upper part of the X-axis moving mechanism. The X-axis moving mechanism is connected to a lower part of an X-axis moving table 16, and has a function to move the X-axis moving table 16 in the X-axis direction. The X-axis moving table 16 moves, for example, between an unloading/loading region in a vicinity of the cassette table 6 and a processing region below a cutting unit 32 to be mentioned below.

On the X-axis moving table 16, a table base 18 and a chuck table 20 are disposed. The chuck table 20 is mounted on the table base 18. On an upper part of the chuck table 20, a porous plate (not depicted) formed of a porous member is disposed. To the porous plate, a suction channel (not depicted) formed in the chuck table 20 is connected at one end thereof. To the other end of the suction channel, a suction source (not depicted) such as an ejector is connected. When the suction source is operated, a negative pressure is produced on a surface of the porous plate. Consequently, the surface of the porous table functions as a holding surface that sucks and holds the tape 7 on the side of the base material layer. Below the chuck table 20, a rotational drive mechanism (not depicted) is disposed to rotate the chuck table 20 about a predetermined axis of rotation. On a radially outer side of the chuck table 20, clamps 24 are disposed to grasp the ring frame 9. The chuck table 20 is moved in the X-axis direction by the above-mentioned X-axis moving mechanism.

Transfer of the frame unit 11 from the temporary placement table 10 onto the chuck table 20 is performed by a first transfer unit 14 disposed at a location adjacent the temporary placement table 10 and opening 4a on and in the upper wall of the bed 4. The first transfer unit 14 has a shaft portion that extends upward from the upper wall of the bed 4, is movable up and down and is rotatable, an arm portion extending in a horizontal direction from an upper end of the shaft portion, and a holding portion disposed on a lower part of a distal end portion of the arm portion. When desired to transfer the frame unit 11 from the temporary placement table 10 onto the chuck table 20 by the first transfer unit 14, the X-axis moving table 16 is moved to position the chuck table 20 in the unloading/loading region. Then, the ring frame 9 of the frame unit 11, which is temporarily placed on the temporary placement table 10, is held by the holding portion, the frame unit 11 is lifted, and the shaft portion is rotated to move the frame unit 11 to above the chuck table 20. Subsequently, the frame unit 11 is lowered and placed on a holding surface 22 of the chuck table 20. Then, the ring frame 9 is fixed by the clamps 24, and at the same time the wafer 1 is held under suction on the chuck table 20 via the tape 7 of the frame unit 11.

The cutting machine 2 includes a support structure 28 arranged above a moving path from the unloading/loading region to the processing region along the X-axis moving table 16 so that the support structure 28 protrudes in a direction transverse to the opening 4a. On the support structure 28, a downwardly directed imaging unit 30 is disposed. While the chuck table 20 is moving toward the processing region below the cutting unit 32, the imaging unit 30 images the front surface 1a of the wafer 1 held under suction on the chuck table 20, whereby the positions and directions of the streets 3 set on the front surface 1a are detected.

In the processing region, the cutting unit (processing unit) 32 is disposed to cut (process) the wafer 1 of the frame unit 11 held on the chuck table 20. The cutting unit 32 includes a cutting blade 34 with an annular grinding stone portion secured on an outer periphery thereof, and a spindle 36 carrying the cutting blade 34 mounted on a distal end portion thereof, serving as an axis of rotation of the cutting blade 34 and extending along the Y-axis direction. To the side of a proximal end of the spindle 36, a rotational drive source (not depicted) such as a motor is connected. When the cutting blade 34 is rotated and the rotating cutting blade 34 is brought into cutting engagement with the wafer 1 included in the frame unit 11 held on the chuck table 20, the wafer 1 can be cut (processed). When the wafer 1 is cut along all the streets 3, the wafer 1 is divided so that the individual device chips are formed. Thereafter, the chuck table 20 is returned to the unloading/loading region by the X-axis moving mechanism.

At a position on the upper wall of the bed 4 and adjacent the temporary placement table 10 and the opening 4a, an opening 4b is formed, and, in the opening 4b, a rinsing unit 38 is accommodated to rinse the frame unit 11 after the processing. The rinsing unit 38 includes a spinner table that holds the frame unit 11 thereon. To a lower part of the spinner table, a rotational drive source (not depicted) is connected to rotate the spinner table at a predetermined speed.

The cutting machine 2 includes a second transfer unit 40 that transfers the frame unit 11 from the chuck table 20, which is positioned in the unloading/loading region, to the rinsing unit 38. The second transfer unit 40 has an arm portion movable along the Y-axis direction, and a holding portion disposed on a lower part of a distal end portion of the arm portion. When desired to transfer the frame unit 11 from the chuck table 20 to the rinsing unit 38 by the second transfer unit 40, the frame unit 11 is first held by the holding portion. The arm portion is then moved along the Y-axis direction, and the frame unit 11 is placed on the spinner table of the rinsing unit 38. Subsequently, the frame unit 11 is held on the spinner table, and the wafer 1 is rinsed.

When desired to rinse the wafer 1 by the rinsing unit 38, a rinsing fluid (typically, a mixed fluid of water and air) is ejected toward the front surface 1a of the wafer 1 while rotating the spinner table. The frame unit 11 rinsed by the rinsing unit 38 is then held in the cassette 13 mounted on the cassette table 6. When desired to hold the frame unit 11 in the cassette 13, the frame unit 11 is transferred from the rinsing unit 38 onto the temporary placement table 10 by using the first transfer unit 14. The unloading unit 12 is then moved toward the cassette 13 to push the frame unit 11 into the cassette 13.

As described above, on the cutting machine 2, the frame unit 11 is unloaded from the cassette 13, the frame unit 11 is held under suction on the chuck table 20, and the wafer 1 included in the frame unit 11 is processed by the cutting unit 32. Subsequently, the frame unit 11 is rinsed by the rinsing unit 38, and is held again in the cassette 13. On the cutting machine 2, the frame units 11 are unloaded one after another from the cassette 13, and wafers 1 are cut one after another by the cutting unit 32 on the chuck table 20.

The cutting machine 2 includes, on an upper part of a housing, a display unit 42 that can display a variety of information. The display unit 42 is configured, for example, of a liquid crystal display, an organic electroluminescent (EL) panel, or the like. The cutting machine 2 also includes an input interface for use in inputting a variety of commands and the like. The input interface is, for example, a touch panel superimposed on a front face of the display unit 42. Therefore, the display unit 42 may be a touch panel display.

The cutting machine 2 also includes a control unit 44 that controls individual elements. The control unit 44 is configured by a computer, which includes a processing device such as a central processing unit (CPU) and a storage device such as a flash memory. The processing device is operated in accordance with software such as programs stored in the storage device, whereby the control unit 44 functions as specific means in which software and the processing device (hardware resources) cooperate with each other. The control unit 44 includes a storage section 46 that stores various kinds of information and the like, and a display control section 48 that controls display on the display unit 42. In the storage section 46, a plurality of sets of processing conditions are stored beforehand, for example, corresponding to the specifications of various wafers 1 to be processed by the cutting machine 2 and various device chips to be formed from the wafers 1.

Each set of processing conditions includes, for example, information regarding the material and size of the corresponding wafer 1 to be processed, the distance between the streets 3 set on the wafer 1, the processing feed speeds of the cutting unit (processing unit) 22 and the wafer 1, the rotational speed of the cutting blade 34, the type of the cutting blade 34, and the like. In the storage section 46, images of key patterns formed on the front surfaces 1a or back surfaces 1b of the respective wafers 1 are also stored beforehand. These images are used when detecting, by the imaging unit 30, the positions of the streets 3 set on the front surface 1a of the wafer 1. An operator of the cutting machine 2 selects one set of processing conditions, which is suited for processing the wafer 1 to be loaded on the cutting machine 2, from the plurality of sets of processing conditions stored in the storage section 46. The control unit 44 controls the cutting unit 32, the chuck table 20 and the like in accordance with the selected set of processing conditions, and allows the cutting (processing) of the wafer 1, which is held on the chuck table 20, to proceed.

However, many sets of processing conditions are stored in the storage section 46 of the cutting machine 2, and sets of processing conditions, which are similar to one another, are also included. When selecting an appropriate set of processing conditions in accordance with the specifications of the wafer 1 and the devices formed thereon, the operator may hence select a wrong set of processing conditions. The selection of the wrong set of processing conditions may lead not only to a failure in obtaining desired processing results, but also to damage such as cracking or chipping on the wafer 1 and a malfunction of the cutting machine 2. In the wafer processing method and machine according to the embodiment, the operator is provided with information useful for determining whether the selected set of processing conditions is appropriate or inappropriate for processing the wafer 1 as an object of processing. The operator therefore determines whether or not the wafer 1 loaded on the cutting machine 2 and the selected set of processing conditions correspond to each other.

To enable the determination by the operator, the positional relationships between the mark 1c of the wafer 1 and the notches 9b and 9c of the ring frame 9 in the frame unit 11 are set for every set of processing conditions. When desired to form the frame unit 11, the directions of the wafer 1 and the ring frame 9 are adjusted so that the mark 1c of the wafer 1 and the notches 9b and 9c of the ring frame 9 are arranged in the positional relationships corresponding to the set of processing conditions for processing the wafer 1.

For example, a relative general angle $\alpha$ (see FIG. 1B) between the position of the first notch 9b and the position of the mark 1c when the frame unit 11 is seen from above is set for every set of processing conditions. The general angle $\alpha$ indicates how much a radius vector has rotated from an initial line (0°) where the initial line means a line segment defined by the first notch 9b and a center 1d of the front surface 1a of the wafer 1 and the radius vector means a line segment defined by the mark 1c and the center 1d. As an alternative, instead of the general angle $\alpha$, a relative general angle β (see FIG. 1B) between the position of the second notch 9c and the position of the mark 1c when the frame unit 11 is seen from above may be set for every set of processing conditions. The general angle β indicates how much a radius vector has rotated from an initial line (0°) where the initial line means a line segment defined by the second notch 9c and the center 1d and the radius vector means the line segment defined by the mark 1c and the center 1d.

Figure 3A:
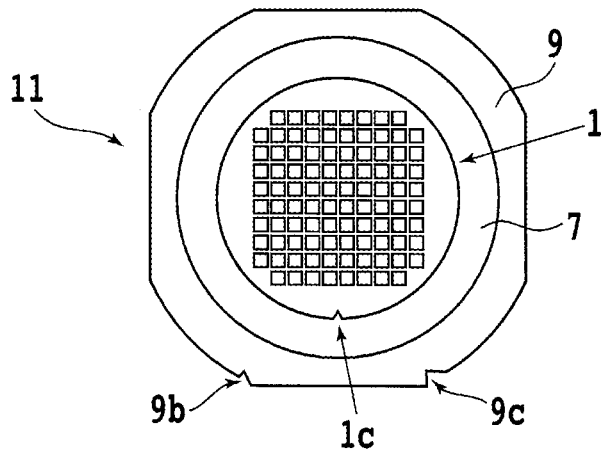
FIG. 3A is a plan view schematically depicting an example of the frame unit of FIGS. 1A and 1B.
Figure 3B:
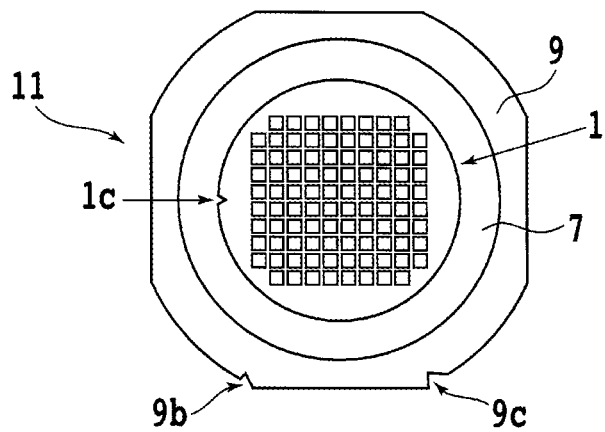
FIG. 3B is a plan view schematically depicting another example of the frame unit of FIGS. 1A and 1B.
Figure 3C:
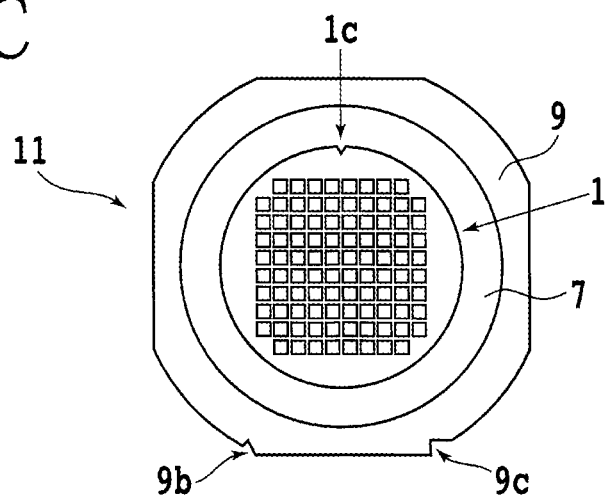
FIG. 3C is a plan view schematically depicting a further example of the frame unit of FIGS. 1A and 1B.

In the storage section 46 of the control unit 44 in the cutting machine 2, representative images, each of which indicates the positional relationships between the mark 1c of the wafer 1 and the notches 9b and 9c of the ring frame 9 in each frame unit 11, are stored in association with the respective sets of processing conditions. FIGS. 3A, 3B, and 3C are plan views schematically depicting examples of the representative images stored in association with the corresponding sets of processing conditions as stored in the storage section 46. The plan view that schematically depicts the frame unit 11 of FIG. 1B may also be stored as a representative image in the storage section 46. As appreciated from a comparison among these individual plan views, the general angles α (general angles β) are different from one another in the respective plan views. In other words, the positional relationships between the mark 1c of the wafer 1 and the notches 9b and 9c of the ring frame 9 are different in each plan view. However, the individual representative images stored in association with the respective sets of processing conditions in the storage section 46 are not required to be all different from one another in the positional relationships, and the positional relationships may be common in some of the representative images.

Each representative image may be formed, for example, by imaging the corresponding frame unit 11 with the imaging unit 30, or by imaging the corresponding frame unit 11 outside the cutting machine 2 with a camera or the like. As an alternative, each representative image may be an illustration or the like that simulates the corresponding frame unit 11. No limitation is imposed on the design of each representative image insofar as the representative image is in a form that allows to understand the positional relationships between the mark 1c of the wafer 1 and the notches 9b and 9c of the ring frame 9. When desired to store a new set of processing conditions in the storage section 46, the corresponding representative image may preferably be also formed and stored.

Figure 4:
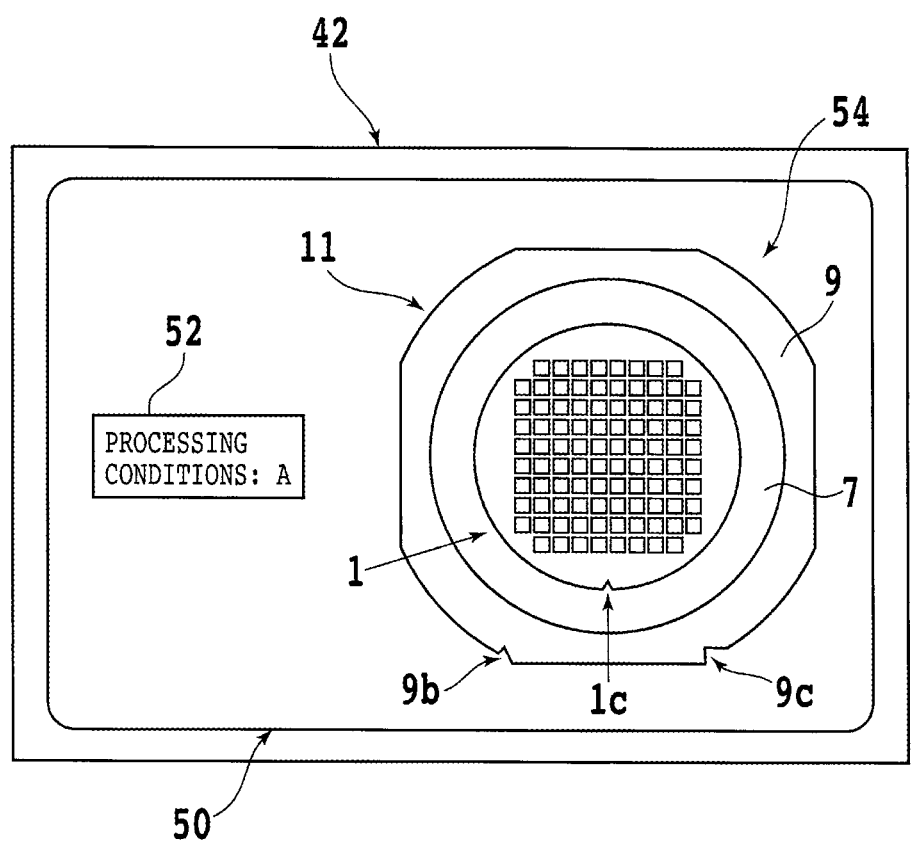
FIG. 4 is a plan view schematically depicting a display unit, with a representative image presented thereon, in the cutting machine of FIG. 2.

The display control section 48 of the control unit 44 has a function to display, on the display unit 42, the representative image stored in association with one set of processing conditions in the storage section 46 when the one set of processing conditions is selected from the plurality of sets of processing conditions stored in the storage section 46. FIG. 4 is a plan view schematically depicting the display unit 42 with a reference image display screen 50, which includes a representative image 54, being displayed thereon. As an alternative, the display control section 48 may display, on the display unit 42, the representative image 54 and information 52 regarding the selected set of processing conditions. As depicted in FIG. 4, it is possible to ascertain, from the representative image 54 displayed on the display unit 42, the positional relationships between the mark 1c of the wafer 1 and the notches 9b and 9c of the ring frame 9. It is understood, for example, that the positional relationships between the mark 1c of the wafer 1 and the notches 9b and 9c of the ring frame 9 in the representative image 54 contained in FIG. 4 conform to their positional relationships in the frame unit 11 depicted in FIG. 3A.

When the operator of the cutting machine 2 selects the set of processing conditions for processing the wafer 1 from the plurality of sets of processing conditions stored in the storage section 46 of the control unit 44, the representative image 54 containing the wafer 1 to be processed under the selected set of processing conditions and the devices formed thereon is displayed on the display unit 42. Accordingly, the operator can make a comparison in the positional relationships between the mark 1c of the wafer 1 and the notches 9b and 9c of the ring frame 9 with respect to the frame unit 11 loaded on the cutting machine 2 and the frame unit 11 in the representative image 54.

If, as a result, the positional relationships are found to conform in both the frame unit 11 loaded on the cutting machine 2 and the frame unit 11 in the representative image 54, the operator can verify that the selected set of processing conditions is proper and the wafer 1 is ready for appropriate processing under the selected set of processing conditions. The operator then operates the cutting machine 2 to perform processing of the wafer 1 by the cutting unit 32 under the selected set of processing conditions. Consequently, the wafer 1 is appropriately processed by the cutting unit 32, thereby obtaining processing results as desired. If the positional relationships are found not to conform between the frame unit 11 loaded on the cutting machine 2 and the frame unit 11 in the representative image 54, on the other hand, it is understood that at least one of the selected set of processing conditions and the wafer 1 loaded on the cutting machine 2 is wrong. Processing of the wafer 1 by the cutting machine 2 without any corrective action on such an error may lead not only to a failure in obtaining desired processing results, but also to damage on the wafer 1 and the cutting machine 2. In this situation, the operator inputs a command to prevent the cutting machine 2 from performing the processing. Moreover, the operator unloads the loaded frame unit 11 to an outside of the cutting machine 2, checks the selected set of processing conditions and the wafer 1, and takes a corrective action.

According to the wafer processing method and machine of the embodiment, when specific one set of processing conditions is selected from the stored plurality of sets of processing conditions, the representative image 54 corresponding to the selected set of processing conditions is displayed on the display unit 42 as described above. Therefore, the operator can determine whether or not the wafer 1 and the selected set of processing conditions correspond to each other, and if not correspond, the operator can stop the processing. Consequently, the processing of the wafer 1 under wrong conditions is not performed, thereby avoiding damage on the wafer 1 and the cutting machine 2.

A description will now be made about the wafer processing method according to the embodiment. FIG. 5 is a flow chart illustrating a flow of individual steps of the wafer processing method. In the processing method, a provision step S10 is first performed to provide the frame unit 11 having the wafer 1, the tape 7, and the ring frame 9. The provision step S10 may be performed, for example, by a tape bonding apparatus (not depicted) that integrates the wafer 1, the tape 7, and the ring frame 9. With the tape bonding machine, the integration is performed so that the mark 1c of the wafer 1 and the notches 9b and 9c of the ring frame 9 are arranged in the positional relationships corresponding to the one set of processing conditions under which the processing of the wafer 1 is to be performed. In the provision step S10, the frame unit 11 with the wafer 1, the tape 7, and the ring frame 9 integrated beforehand in predetermined directions may be provided instead. In the provision step S10, the cassette 13 with the integrated frame unit 11 held thereon is loaded onto the cutting machine 2.

In the wafer processing method of the embodiment, a processing conditions selection step S20 is also performed to select the one set of processing conditions, under which the wafer 1 is to be processed by the cutting unit (processing unit) 32, from the plurality of sets of processing conditions stored in the cutting machine (processing machine) 2. The processing conditions selection step S20 may be performed before the provision step S10, or may be performed after the provision step S10. In the processing conditions selection step S20, the operator selects the one set of processing conditions by using, for example, an operation screen displayed on the display unit 42.

Next, a representative image display step S30 is performed to display on the display unit 42 the representative image 54 (see FIG. 4) stored in the cutting machine (processing machine) 2 in associated with the one set of processing conditions selected in the processing conditions selection step S20. Upon receipt of a command to select the one set of processing conditions through the processing conditions selection step S20, the representative image display step S30 is performed by causing the display control section 48 to control the display unit 42 so that the representative image 54 associated with the selected set of processing conditions is displayed. When the representative image display step S30 is performed, the representative image 54 is displayed on the display unit 42. As depicted in FIG. 4, in the representative image 54 displayed on the display unit 42 in the representative image display step S30, the representative example of the frame unit 11 is presented with the notches 9b and 9c of the ring frame 9 and the mark 1c of the wafer 1 being in the predetermined positional relationships.

The operator of the cutting machine 2 then compares the frame unit 11 loaded on the cutting machine 2 and the frame unit 11 in the representative image 54, and determines whether or not the positional relationships between the mark 1c of the wafer 1 and the notches 9b and 9c of the ring frame 9 in the loaded frame unit 11 conform to the corresponding positional relationships in the representative image 54. Specifically, after the presentative image display step S30, a determination step S40 is performed to determine, through a comparison between the representative example of the frame unit 11 presented in the representative image 54 and the frame unit 11 provided in the provision step S10, whether the selected set of processing conditions is appropriate or inappropriate.

In the determination step S40, the operator visually verifies the frame unit 11, for example, pulled out onto the temporary placement table 10 from the cassette 13, and compares it with the representative image 54 displayed on the display unit 42. As an alternative, the operator may beforehand store the positional relationships in the frame unit 11 to be held in the cassette 13, and may determine whether or not the positional relationships presented in the representative image 54 displayed on the display unit 42 conform to the own memory of the operator. As another alternative, the determination step S40 may also be performed by functions of the control unit 44. The control unit 44 may command the imaging unit 30 to image the frame unit 11, for example, while the frame unit 11 is transferred to the chuck table 20 after its unloading from the cassette 13. The positional relationships in the frame unit 11 may then be detected from the image so captured. In this case, the control unit 44 determines whether or not the positional relationships presented in the representative image 54 conform to the positional relationships in the frame unit 11 presented in the captured image.

If the selected set of processing conditions is determined to be appropriate in the determination step S40 (S41), a processing step S50 is performed to cut (process) the wafer 1 by the cutting unit (processing unit) 32 under the selected set of processing conditions. In the processing step S50, the frame unit 11 is transferred to and held on the chuck table 20, and the wafer 1 held on the chuck table 20 is cut, specifically subjected to dicing processing by the cutting unit 32. Subsequently, an unloading step S60 is performed to unload the processed wafer 1 from the cutting machine 2. If the selected set of processing conditions is determined to be inappropriate in the determination step S40 (S41), on the other hand, an unloading step S60 is performed to unload the frame unit 11 from the cutting machine (processing machine) 2 without performing the processing step S50. As an alternative, an additional selection step may be performed to newly select another one set of processing conditions. Consequently, the wafer 1 is not processed under inappropriate processing conditions.

Further, the above-described wafer processing machine and the method of the embodiment can be practiced with modifications as needed within a scope not departing from the objects of the present invention. In the embodiment described above, the description has been made taking as an example the case in which the wafer processing machine is the cutting machine 2 that cuts the wafer 1 for dicing processing. However, the wafer processing machine is not limited to such a cutting machine. Specifically, the wafer processing machine may be a grinding machine that grinds the wafer 1 from the side of the back surface 1b, or a laser processing machine that processes the wafer 1 with a laser beam along the streets 3. Furthermore, in the embodiment described above, the description is made about the case in which the mark 1c formed in the outer peripheral portion of the wafer 1 is a notch or an orientation flat that indicates the crystal orientation of the wafer 1. However, the mark 1c is not limited to such a notch or orientation flat. For example, the mark 1c may be a pattern of a specific shape disposed on the front surface 1a of the wafer 1.

The present invention is not limited to the details of the above-described preferred embodiment. The scope of the invention is defined by the appended claims and all changes and modifications as fall within the equivalence of the scope of the claims are therefore to be embraced by the invention.

What is claimed is:

1. A wafer processing method for processing a wafer, in an outer peripheral portion of which a mark is formed, by a processing machine including a processing unit and a display unit, comprising:
   a provision step of providing a frame unit having the wafer, a tape bonded on a front surface or back surface of the wafer and having a diameter greater than the wafer, and a ring frame having an opening greater in diameter than the wafer and carrying at an inner peripheral portion thereof the tape bonded at an outer peripheral portion thereof to the ring frame;
   a processing conditions selection step of selecting one set of processing conditions for processing the wafer by the processing unit from a plurality of sets of processing conditions stored in the processing machine; and
   a representative image display step of displaying a representative image that is stored in the processing machine in association with the set of processing conditions as selected in the processing conditions selection step, on the display unit, wherein the ring frame has a notch formed in an outer periphery thereof, in the frame unit, the mark formed in the outer peripheral portion of the wafer and the notch of the ring frame are in a positional relationship set in accordance with the selected set of processing conditions for processing the wafer by the processing unit, each of the sets of processing conditions stored in the processing machine is associated with the positional relationship between the notch in the ring frame and the mark formed in the outer peripheral portion of the wafer, the frame unit provided in the provision step is formed of the ring frame, the wafer, and the tape integrated together so that the notch of the ring frame and the mark of the wafer are in the positional relationship, and the representative image displayed on the display unit in the representative image display step presents a representative example of the frame unit, in which the notch of the ring frame and the mark of the wafer are in the positional relationship, a determination step of, after the representative image display step, determining, through a comparison between the representative example presented in the representative image and the frame unit provided in the provision step, whether the selected set of processing conditions is appropriate or inappropriate, wherein if the selected set of processing conditions is determined to be appropriate in the determination step, a processing step is performed to process the wafer by the processing unit under the selected set of processing conditions, and if the selected set of processing conditions is determined to be inappropriate in the determination step, an unloading step is performed to unload the frame unit from the processing machine.

2. The wafer processing method according to claim 1, wherein the processing to be performed in the processing step is dicing processing to divide the wafer, and the selected set of processing conditions includes a size of the wafer, a distance between streets set on the wafer, processing feed speeds of the processing unit and the wafer, and a key pattern formed on the front surface or back surface of the wafer.

3. The wafer processing method according to claim 1, wherein an angle $\alpha$ between the notch in the ring frame and the mark formed in the outer peripheral portion of the wafer is set for each of the processing conditions.

4. The wafer processing method according to claim 3, wherein an angle $\beta$ between another notch in the ring frame and the mark formed in the outer peripheral portion of the wafer is set for each of the processing conditions.

* * * * *